United States Patent
Asamitsu et al.

[11] Patent Number: 6,166,947
[45] Date of Patent: Dec. 26, 2000

[54] MANGANESE OXIDE MATERIAL HAVING $MNO_3$ AS A MATRIX

[75] Inventors: Atsushi Asamitsu; Yasuhide Tomioka; Hideki Kuwahara, all of Tsukuba; Yoshinori Tokura, Tokyo, all of Japan

[73] Assignees: Agency of Industrial Science and Technology Ministry of International Trade & Industry; Angstrom Technology Partnership, both of Tokyo; Sanyo Electric Co., Ltd., Moriguchi, all of Japan

[21] Appl. No.: 09/335,525

[22] Filed: Jun. 18, 1999

Related U.S. Application Data

[62] Division of application No. 09/039,397, Mar. 16, 1998.

[30] Foreign Application Priority Data

Mar. 14, 1997 [JP] Japan ....................................... 9-60632

[51] Int. Cl.⁷ .................................................. G11C 11/00
[52] U.S. Cl. ........................................... 365/158; 365/171
[58] Field of Search ..................... 365/158, 171, 365/66, 160

[56] References Cited

U.S. PATENT DOCUMENTS 5,487,356  1/1996  Li et al. .
5,506,077  4/1996  Koksbang .
6,063,491  5/2000  Fujikata et al. ........................... 428/332

FOREIGN PATENT DOCUMENTS 0 710 734  5/1996  European Pat. Off. .

OTHER PUBLICATIONS

A. Asamitsu, Chemical Abstracts, vol. 127, No. 14, Oct. 6, 1997, AN:198170, "Current Switching of Resistive States in magnetoresistive Manganites".

Yasuhide Tomioka et al, "Anomalous Magnetotransport Properties of $Pr_{1-x}Ca_xMnO_3$", *Journal of the Physical Society of Japan*, vol. 64, No. 10, Oct. 1995, pp. 3626–3630.

Y. Tomioka et al, "Magnetic–field–induced–metal–insulator phenomena in $Pr_{1-x}Ca_xMnO_3$ with controlled charge–ordering instability", *The American Physical Society*, vol. 53, No. 4, Jan. 15, 1996, pp. R1689–R1692.

H. Kuwahara et al, "A First–Order Phase Transition Induced by a Magnetic Field", *Science*, vol. 270, Nov. 10, 1995, pp. 961–963.

*Primary Examiner*—Vu A. Le
*Attorney, Agent, or Firm*—Oblon, Spivak, McClelland, Maier & Neustadt, P.C.

[57] ABSTRACT

A manganese oxide material has $MnO_3$ as a matrix. It is an antiferromagnetic insulator and, when subjected to an electrical current or electric field, it is transformed into a ferromagnetic metal.

2 Claims, 3 Drawing Sheets

MANGANESE OXIDE MATERIAL HAVING MNO$_3$ AS A MATRIX

This application is a division of U.S. Ser. No. 09/039,397 filed on Mar. 16, 1998.

BACKGROUND OF THE INVENTION

1. Field of the Invention

The present invention relates to a manganese oxide material having MnO$_3$ as a matrix, that exhibits current- and/or electrical field-induced insulator-to-metal transition and the accompanying antiferromagnetic-to-ferromagnetic transition and can advantageously be used as a switching device or memory device.

2. Description of the Prior Art

The discovery of high-temperature superconductivity in copper oxides has drawn attention to the spin-charge coupled dynamics of ozides of transition metals. In particular, considerable research is being conducted on perovskite type manganese oxide materials that exhibit negative colossal magnetoresistance. In the course of work on the design and development of related substances, research has been further stimulated by the discovery of the colossal magnetoresistance ("CMR") effect in which a type of charge ordered phase field fusion is manifested as a change of several magnitudes in electrical resistivity, and the discovery of field-induced antiferromagnatic insulator-to-ferromagnetic metal transitions that can be described as an extreme magnetoresistance effect. While there are known many perovskite type oxide materials that exhibit the CMR effect, such as $Pr_{1-x}Ca_xMnO_3$, $Pr_{1-x}(Ca,Sr)_xMnO_3$ and $Nd_{0.5}Sr_{0.5}MnO_3$, in each of these materials the CMR effect is controlled by an external magnetic field. This has made application to electronics-related fields difficult.

An object of the present invention is to provide a manganese oxide material exhibiting antiferromagnetic insulator-to-ferromagnetic metal transition that can be controlled by a current and/or electrical field.

SUMMARY OF THE INVENTION

In accordance with the present invention the above object is attained by a manganese oxide material having MnO$_3$ as a matrix, that is an antiferromagnetic insulator transformed into a ferromagnetic metal when applying an electrical current or electrical field to the insulator.

In the manganese oxide material of this invention, antiferromagnetic insulator-to-ferromagnetic metal transition in induced by a current or electrical field. By constituting a switching device or memory device of the material, the incorporation or the device into existing electronic equipment can be facilitated.

Further features of the invention, its nature and various advantages will be more apparent from the accompanying drawings and following detailed description of the invention.

DESCRIPTION OF PREFERRED EMBODIMENT

Figure 1:
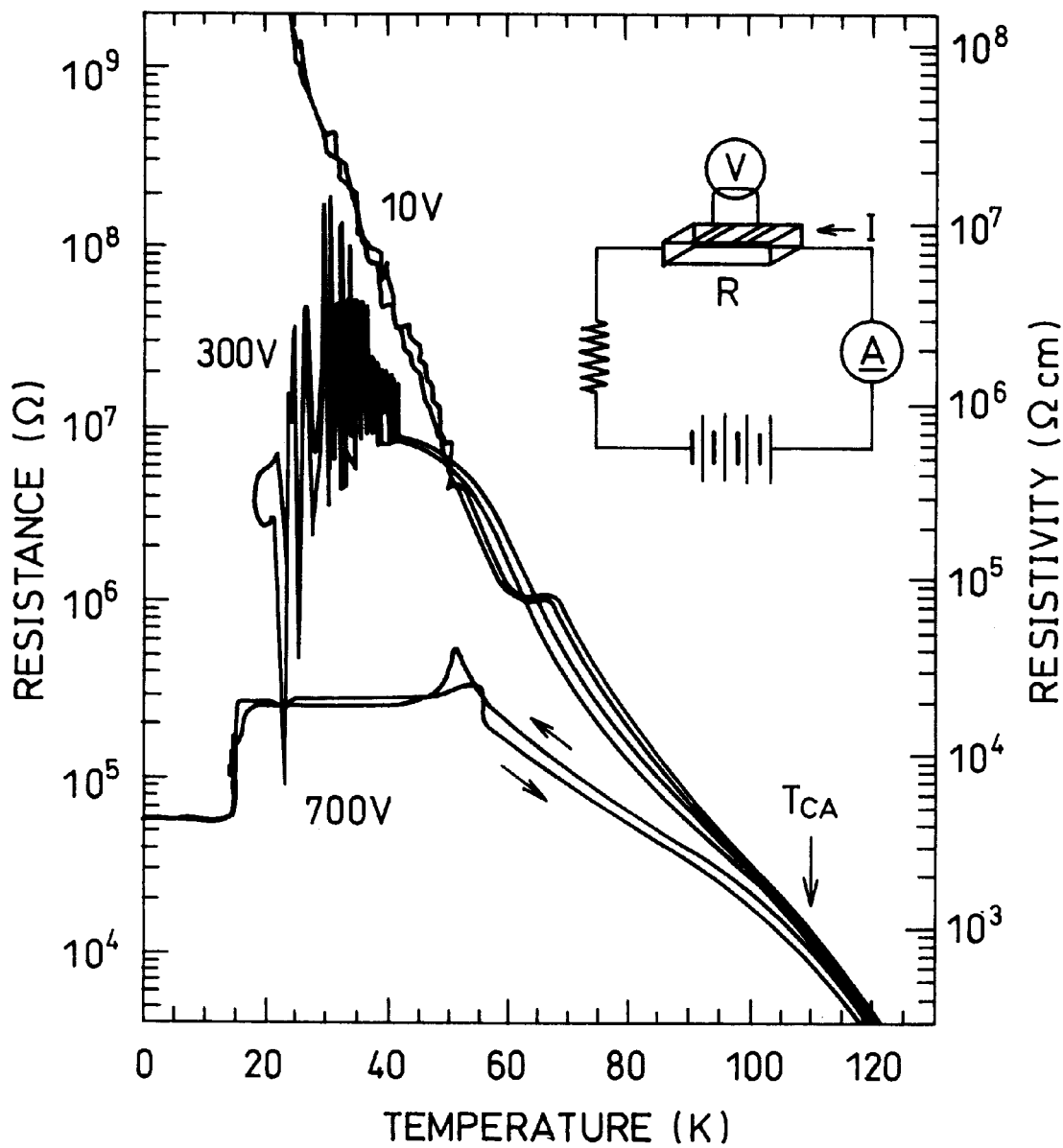
FIG. 1 is a graph showing the relationship between electrical resistivity and temperature of an antiferromagnetic insulator according to the present invention when subjected to voltages of 10 V, 300 V and 700 V.

When the present inventors measured current-voltage (I-V) characteristics, using MnO$_3$-based manganese oxide system crystal (represented by the general formula $R_{1-x}A_xMnO_3$ in which R is a rare earth ion and A is an alkaline earth ion) formed as an antiferromagnetic insulator by the charge order phenomenon, it was found that when a specific threshold electrical current or field was applied, in the crystal body reversible or irreversible switching from a state of high resistance to a state of low resistance takes place. That is, it was found that transition from antiferromagnetic insulator to ferromagnetic metal could be induced by application of not a magnetic field but an electrical current or field.

The present invention was achieved based on the above findings, and relates to a manganese oxide material that is a MnO$_3$-based antiferromagnetic insulator exhibiting transitions from antiferromagnetic to ferromagnetism and/or transitions from insulator to metal when subjected to a current or electrical field.

An example of a method that may be used to produce the maganese oxide based antiferromagnetic insulator is described below.

In a process used to produce a normal ceramic material (sintered body), oxides of Pr, Ca, Sr and Mn, or compounds that can be substituted for such oxides, are powdered to form a starting mixture. Examples of oxides that may be used include $Pr_6O_{11}$, CaO, SrO, and $Mn_3O_4$. Example of compounds that can be heated to substitute for such oxides include carbonates such as $Pr_2(CO_3)_3$, $CaCO_3$, $SrCO_3$ and $Mn(CO_3)$, and acid carbonates such as $Pr(HCO_3)_3$, $Ca(HCO_3)_2$, $Sr(HCO_3)_2$ and $Mn(HCO_3)_2$.

The starting powders are mixed in a proportion to produce $R_{1-x}A_mMnO_3$. While various methods may be used to prepare the mixture, a method that can be advantageously used is that in which a volatile organic solvent much as alcohol or ketone is added. The starting powder mixture is sintered by heating in air at a temperature of 1,000° C. and the sintered body is then pulverized to a fine powder. This is repeated a plurality of times to ensure the components are uniformly mixed. The powder is then press-formed into rods, sintered by being heated in air at 1,100° C., and crystal growth of the sintered body thus obtained is then effected by the floating zone method. This process is preferably carried out in an atmosphere of pure oxygen, and the crystal is grown at 3 to 7 mm/h. If required, a binder may be used in the above press-forming step.

The manganese oxide based crystal body thus obtained is subjected to x-ray diffraction analysis, electron-beam microanalysis, ICP mass analysis and titration analysis. The formation of an antiferromagnetic insulator can be confirmed from the temperature dependence of the electrical resistivity and the magnetic susceptibility. Samples of prescribed dimensions were then cut from the thus-obtained antiferromagnetic insulator material to obtain small pieces or thin films that were provided with electrodes for applying a current or electrical field thereto and for measuring output or resistivity thereof. Under application of a high electrical field, at a certain threshold voltage the sample is metallized thereby functioning as a switching device. Similarly, by providing the thin-film antiferromagnetic insulator with electrodes and reading a state of low resistance under high voltage as "1" and an insulating state of zero voltage as "0", the antiferromagnetic insulator can function as a memory device.

Thus, the manganese oxide material of this invention can be constituted as a switching device by utilizing the insulator-to-metal transition, or as a memory device by utilizing the antiferromagnetic-to-ferromagnetic transition.

As described in the foregoing, in the current-and/or electrical field-induced phase transitions in the manganese oxide system crystal according to this invention, the change in electrical resistance is of several orders of magnitude, in addition to which antiferromagnetic-to-ferromagnetic transitions take place under zero magnetic field conditions. This is a type of electromagnetism and uses an entirely new operating principle that has not been in existence before. Moreover, since there is no particular need for a magnetic field in order to effect operation, it has the advantage of being able to be readily incorporated in existing electronic circuits.

Furthermore, it can be readily envisaged to use the manganese oxide material of this invention as a switching device that utilizes changes in resistance states, and as a memory device that utilizes changes in magnetism between antiferromagnetic and ferromagnetism. It can also be used for a form of lithography by using the probe of a scanning tunneling microscope (STM) to apply a high electrical field to freely write in ferromagnetic metal regions in the antiferromagnetic insulator matrix.

Embodiments of the invention are described below. However the invention is not limited to these embodiments.

Powders of $Pr_6O_{11}$, $CaCO_3$ and $Mn_3O_4$ were mixed to form a Pr:Ca:Mn atomic ratio of 0.7:0.3:1 (corresponding to the general formula $R_{1-x}A_xMnO_3$ in which x=0.3). Ethanol was added and the mixture was stirred for 30 minutes in an agate mortar. The resultant mixture was heated in air at 1,050° C. for 24 hours, pulverized, remixed and again sintered for 10 hours at 1,050° C. to form a powder mixture. A 2 ton/cm² hydraulic press was then used to press-form the powder into rods measuring 5 mm in diameter and some 80 mm in length, which were sintered by being heated in air for 48 hours at a temperature of 1,100° C.

A floating zone furnace equipped with a pair of halogen incandescent lamps and a hemielliptic shaped focussing mirror was then used to grow crystals on the rods. For this, the rods of the starting material and the speed rods were rotated in opposite directions at a relative speed of 30 to 40 rpm while the crystals were grown at a rate of 3 to 7 mm/h in a stream of 100% oxygen.

The central portion of the crystal thus obtained was cut into rectangles measuring approximately 5 mm in length, 1 mm in width and 0.5 mm in thickness. Silver bonding paste was then used to attach four electrodes to measure the electrical resistance of the crystals (see FIG. 1 inset).

FIG. 1 shows the temperature dependence of the resistance in a zero magnetic field of the above crystals ($Pr_{0.7}Ca_{0.3}MnO_3$) measured under applied voltages of 10 V, 300 V and 700 V. The inset diagram shows the measurement circuit used. A 1-megohm series resistance was incorporated into the circuit to protect the samples from excess current. When the applied voltage was small (10 V) the samples exhibited insulator-like behavior. However, when the voltage was increased, at or below TCA (spin-canted antiferromagnetic transition temperature), resistance decreased and the non-linear electrical conductivity effect became pronounced.

In the case of the 300 V curve, for example, over time noise behavior up to 40 K showed swings between high and low resistance states. Compared to the resistance at the applied voltage of 10 V, under a high applied voltage of 700 V resistance was lower by a magnitude of better than five.

Figure 2:
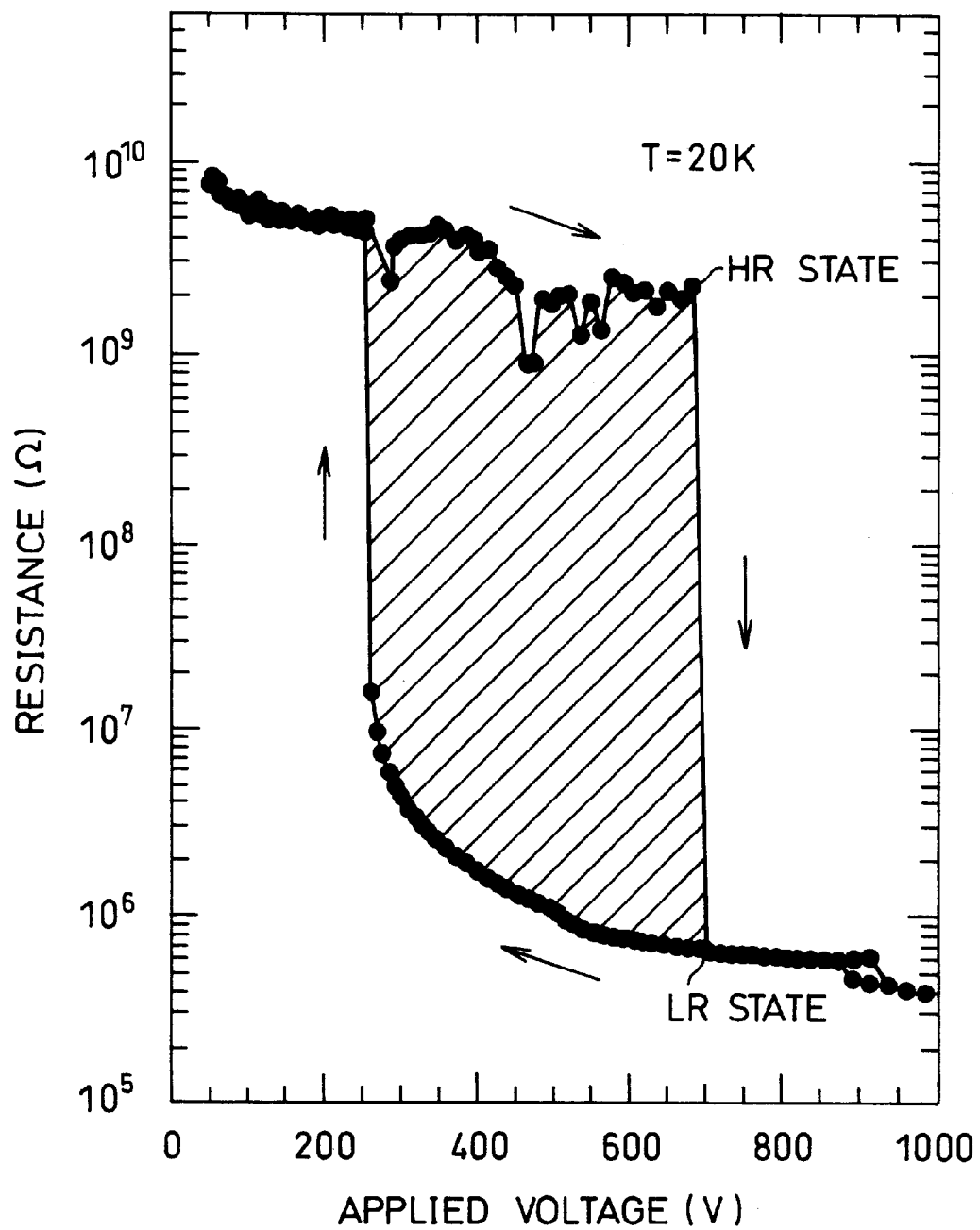
FIG. 2 in a graph showing the relationship between resistance and applied voltage at 20 K in the case of the antiferromagnetic insulator of FIG. 1.

FIG. 2 shows how resistance changed relative to the applied voltage under a constant temperature (20 K) and zero magnetic field conditions.

The increase in applied voltage was accompanied by a gradual decrease in resistance from a high resistance of around $10^{10}$ ohms, switching at a threshold voltage to a low resistance state in the order of $10^5$ ohms. Then decreasing the applied voltage produced hysteresis, indicated by the shaded portion, following which the crystals switched back to the original resistance state.

The charge-ordered antiferromagnetic insulator state is easily broken down by a magnetic field, effecting a transition to the ferromagetic metal phase. This means that the dissolubility of the charge-ordered phase can be further controlled by using an external magnetic field. Therefore, it is possible to use an external field to control the threshold current or threshold electrical field at which current- or electrical field-induced insulator-to-metal transition takes place.

Figure 3A:
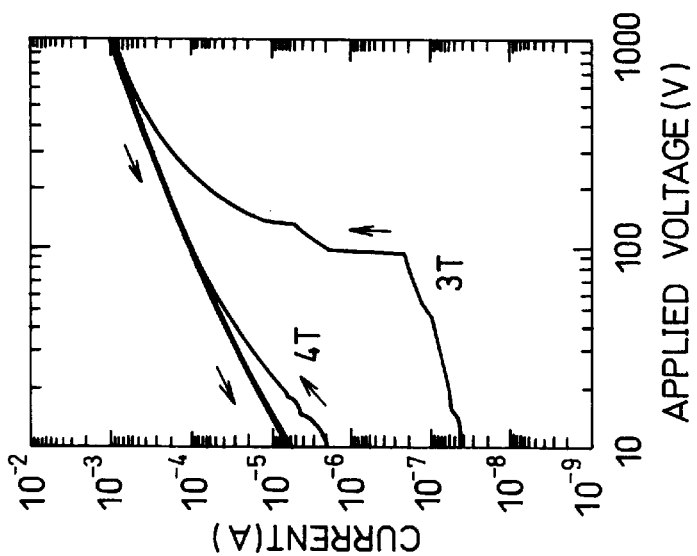
FIG. 3(a) is a graph showing the relationship between current and applied voltage when the field of the antiferromagnetic insulator of FIG. 1 in zero T and four T.
Figure 3B:
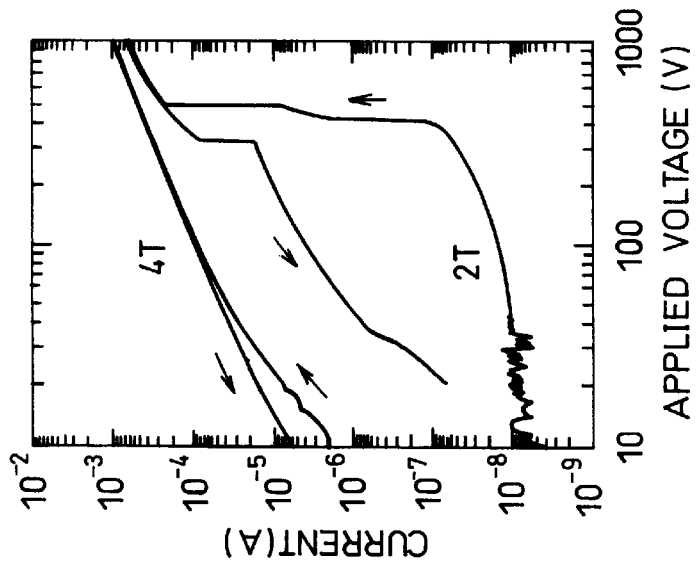
FIG. 3(b) in a graph showing the relationship between current and applied voltage when the field of the insulator of FIG. 1 is two T and four T.
Figure 3C:
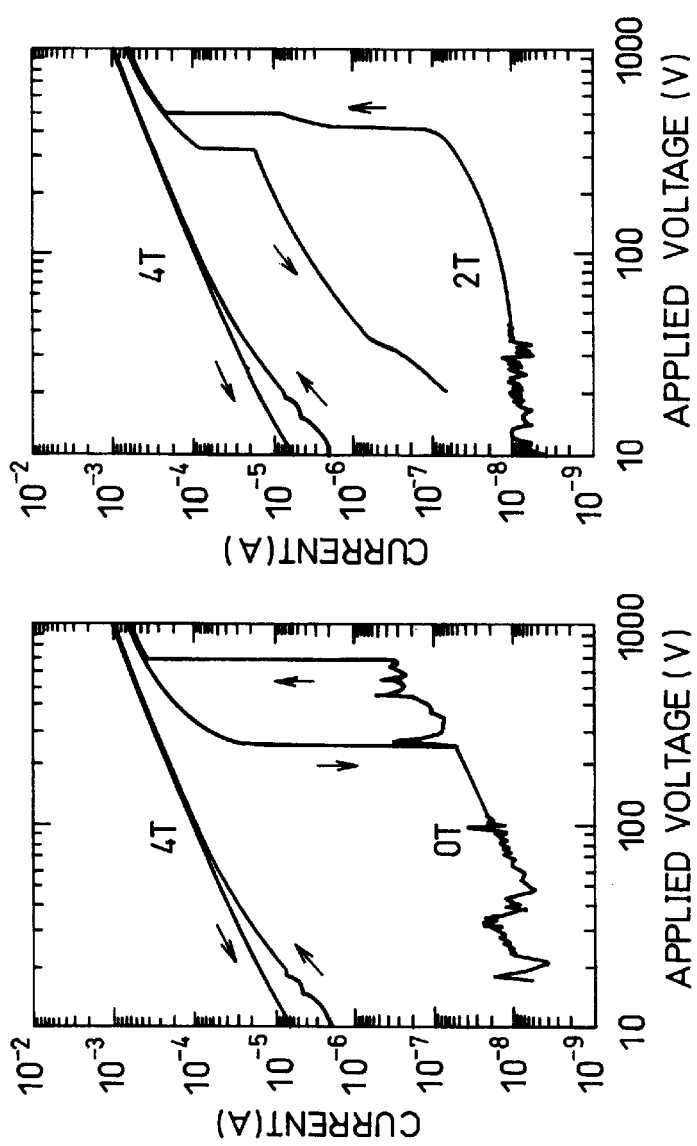
FIG. 3(c) is a graph showing the relationship between current and applied voltage when the field of the insulator of FIG. 1 is three T and four T.

FIG. 3 snows graphs of the relationship between voltage applied to samples at a temperature of 20 K, and current flowing in the samples (voltage-current characteristic), with FIG. 3(a) showing the relationship under a zero magnetic field, FIG. 3(b) at a field of two T, and FIG. 3(c) at a field of three T. To provide a common reference, graph also shows current flow at a field of four T. Under a field of four T, there is a full transition of the samples to ferromagnetic metal, so this shows the degree of metallization that has taken place when switching occurs. Namely, in the case of FIG. 3(c), when a voltage of around 100 V is applied the current shows a sharp rise, while the reversion curve is the same as that of the four T field. This switching shows that metallization of the sample has taken place, meaning the sample can be used as a memory device.

What is claimed is:

1. A method of switching an electronic device, comprising:
applying an electric field or current to a manganese oxide insulator of the formula: $R_{1-x}A_xMnO_3$, wherein R is a rare earth ion and A is an alkaline earth ion, integrated with the circuitry of the electronic device, thereby causing a switching effect as the manganese oxide insulator transitions from the antiferromagnetic insulator state to the metallic ferromagnetic state.

2. A method of imparting memory capacity to an electronic device, comprising:
applying an electric field or current to a manganese oxide insulator of the formula: $R_{1-x}A_xMnO_3$, wherein R is a rare earth ion and A is an alkaline earth ion, integrated with the circuitry of the electronic device, thereby causing a memory effect as the manganese oxide insulator transitions from the antiferromagnetic insulator state to the metallic ferromagnetic state.

* * * * *